(12) United States Patent  (10) Patent No.: US 8,508,947 B2
Ganesan et al.  (45) Date of Patent: Aug. 13, 2013

(54) FLEX CABLE AND METHOD FOR MAKING THE SAME

(75) Inventors: Sanka Ganesan, Chandler, AZ (US); Mohiuddin Mazumder, San Jose, CA (US); Zhichao Zhang, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 12/896,579

(22) Filed: Oct. 1, 2010

(65) Prior Publication Data

US 2012/0081858 A1 Apr. 5, 2012

(51) Int. Cl.
*H05K 1/00* (2006.01)
*H05K 7/00* (2006.01)

(52) U.S. Cl.
CPC .................................. *H05K 7/00* (2013.01)
USPC ..................... 361/749; 174/117 FF (58) Field of Classification Search
CPC ....................................................... H05K 7/00
USPC ............... 361/760, 785, 749, 777; 174/261, 174/117 F, 117 FF, 254, 268, 72 A; 439/67, 439/77, 941; 257/685, 693, 698, 724, E25.023, 257/E25.26
See application file for complete search history.

(56) References Cited

U.S. PATENT DOCUMENTS

| | | | | |
|---|---|---|---|---|
| 4,990,724 A | * | 2/1991 | Suppelsa et al. | 174/261 |
| 5,789,815 A | * | 8/1998 | Tessier et al. | 257/723 |
| 5,844,783 A | * | 12/1998 | Kojima | 361/777 |
| 7,888,784 B2 | * | 2/2011 | Gurumurthy et al. | 257/685 |
| 2005/0078463 A1 | * | 4/2005 | Chheda et al. | 361/789 |
| 2008/0066950 A1 | * | 3/2008 | Tanaka | 174/255 |
| 2011/0216501 A1 | * | 9/2011 | Hendren et al. | 361/679.55 |

* cited by examiner

*Primary Examiner* — Yuriy Semenenko
(74) *Attorney, Agent, or Firm* — Blakely, Sokoloff, Taylor & Zafman LLP (57) ABSTRACT

An assembly of substrate packages interconnected with flex cables. The assembly allows input/output (I/O) signals to be speedily transmitted between substrate packages via flex cable and without being routed through the motherboard. Embodiments relate to a substrate package providing detachable inter-package flex cable connection. The flex cable comprises a transmission region that includes a plurality of signal traces and a ground plane. A plurality of solder mask strips are disposed on the plurality of signals traces to provide anchoring for the signal traces. The solder mask strips intersect the signals traces. The exposed signal traces and the ground plane are coated with organic solderability preservative material. Hermetically-sealed guiding through holes are provided on the substrate package as a mechanical alignment feature to guide connection between flex cables and high speed I/O contact pads on the substrate package. Embodiments of the method of fabrication relate to simultaneously forming hermetically-sealed guiding through holes and I/O contact pads.

15 Claims, 6 Drawing Sheets

FLEX CABLE AND METHOD FOR MAKING THE SAME

BACKGROUND OF INVENTION

Signals from a substrate package travel to another substrate package attached to a common motherboard through the sockets and motherboard. Signals traveling on this path are susceptible to signal degradation and losses due to on-die parasitics, transmission loss, return loss and cross talks. Flex cable interconnection provides improved signal transmission quality and transfer rate.

Figure 1A:
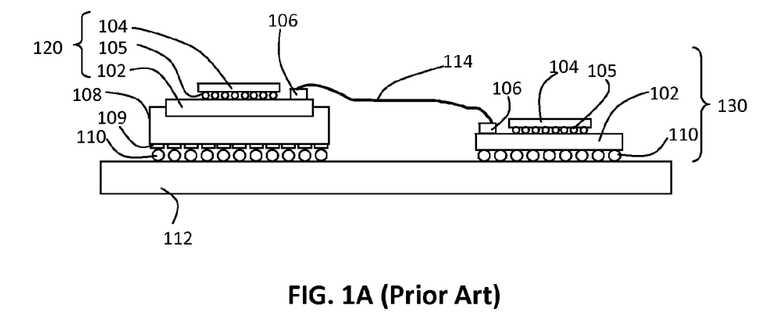
FIG. 1A and FIG. 1B illustrate side views of known flex cable connection between substrate packages.

FIG. 1A illustrates a cross sectional view of a known inter-package flex cable connection. Substrate package 120 includes die 104 attached to substrate body 102 via die bumps 105. Substrate package 120 is mounted on socket 108. Socket 108 has socket contacts 109 soldered to solder balls 110. Solder balls 110 are reflowed to form connection with motherboard 112. Substrate package 120 is interconnected with another substrate package 130 attached to motherboard 112 by way of flex cable 114. Flex cable 114 is attached to substrate packages 120, 130 by way of connector 106. Connector 106 is soldered on substrate body 102 and forms part of substrate body 102. Connector 106 and flex cable 114 are commercially available. Signals between substrate packages 120, 130 are transmitted via flex cable 114 without having to route through socket 108 or motherboard 112.

Figure 1B:
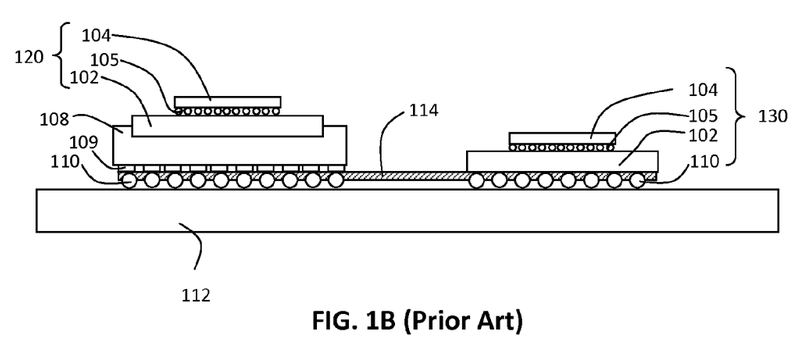

FIG. 1B illustrates another known inter-package flex cable connection. In relation to substrate package 120, flex cable 114 is inserted between socket 108 and motherboard 112. One end of flex cable 114 is soldered to socket contacts 109 while the other end of flex cable 114 is soldered to the land side of substrate package 130. Signals between substrate packages 120, 130 are transmitted via flex cable 114.

DETAILED DESCRIPTION OF ILLUSTRATED EMBODIMENTS

Reference throughout the specification to "one embodiment" or "an embodiment" means that a particular feature, structure, characteristic or step described in connection with the embodiment is included in at least one embodiment of the present invention. Thus, the appearance of said phrases in various places throughout the specification does not necessarily all refer to the same embodiment unless otherwise expressed. Furthermore, the particular features, structures, characteristics or steps recited in the specification may be combined in any suitable manner in one or more embodiments. Accordingly, all such variations and modifications are included within the intended scope of the embodiments of the present invention as defined by the following claims.

Figure 2:
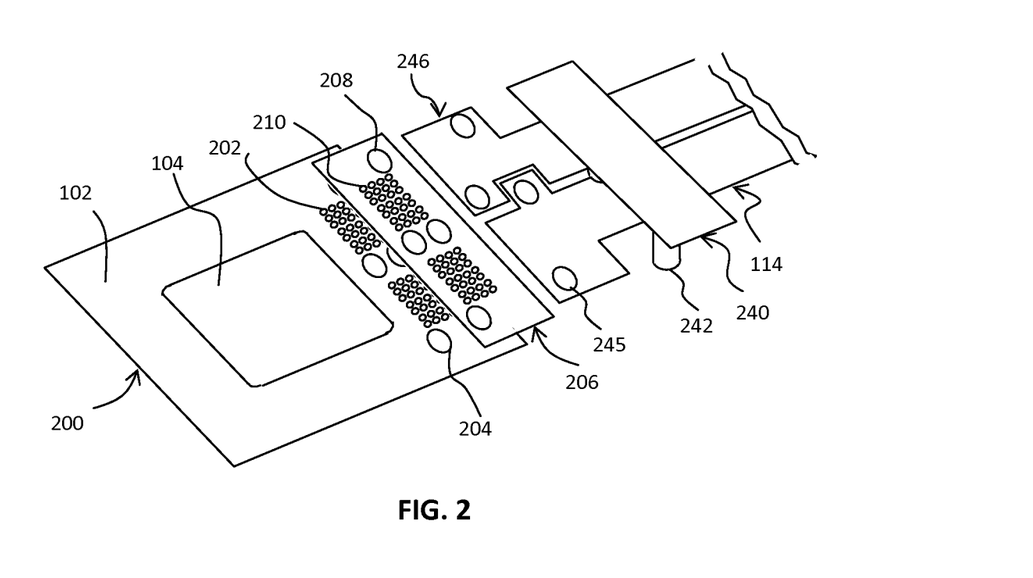
FIG. 2 illustrates an exploded view of an embodiment of the invention.

FIG. 2 illustrates an exploded view of an embodiment of the invention. The exploded view illustrates various parts which may be assembled to provide detachable inter-package connection between substrate packages 200. Details of each part will be presented in the following paragraphs. Semiconductor die 104 may be electrically and mechanically coupled to substrate body 102 of substrate package 200. A plurality of contact pads 202 may be provided on substrate body 102 to transmit signals or information to other substrate packages 200 as well as to receive signals from other substrate packages 200. In one embodiment, the contact pads 202 may comprise high speed input/output (I/O) terminals to speedily transmit and receive signals to and from other substrate packages 200. In an embodiment, I/O contact pads 202 may be formed on the die side surface of substrate body 102, as illustrated in FIG. 2. In another embodiment, I/O contact pads 202 may be formed on the lands side surface of substrate body 102. A plurality of substrate guiding through holes 204 are formed on substrate body 102 as a mechanical alignment feature to guide assembly of other parts with substrate package 200.

Still referring to FIG. 2, an embodiment of the invention may include one or more flex interconnects 114 to provide electrical connection between substrate package 200 and other substrate packages 200. For example, flex interconnects 114 may comprise flex cables. In another embodiment, flex cables 114 may be provided on top of substrate package and other substrate packages 200 to bypass signal discontinues such as package plated through holes, sockets, motherboard via stubs. In one embodiment, substrate package 200 and other substrate packages 200 may comprise any type of processors, microprocessors, digital signal processors, microcontrollers, or any other type of processors, application specific integrated circuits (ASICs), and/or any type of memory devices such as, for example, dynamic random access memory (DRAM) devices, synchronous dynamic random access memory (SDRAM) devices, read-only memory (ROM) devices, or any other volatile or non-volatile memory devices. In another embodiment, the flex cables interconnects 114 from the top of the IA device package 200 may be connected to a printed circuit board which may contain memory devices (such as DRAMs, volatile or non-volatile memories) or graphic devices, and other application specific integrated circuit devices. In another embodiment, substrate packages 200 may comprise any other circuits that may require high speed signaling between them. In an embodiment, each end of flex cables 114 may include one or more cable guiding through holes 245. Cable guiding through holes 245 are configured to align flex cables 114 against substrate guiding through holes 204. In one embodiment, substrate package 200 may be electrically coupled to motherboard 112.

In an embodiment, flex connector 206 may be provided as an interface between substrate package 200 and flex cables 114. An embodiment of flex connector 206 may include a plurality of connector guiding through holes 208 and a plurality of connector contacts 210. Connector guiding through holes 208 are to be aligned against substrate guiding through holes 204 and cable guiding through holes 245. Connector contacts 210 are configured to form electrical connection with I/O contact pads 202. In one embodiment, a finish may be formed on connector pads 210. In an embodiment, guiding plate 240 may be further provided to maintain alignment of flex cables 114 and flex connector 206 with substrate package 200. An embodiment of guiding plate 240 may include a plurality of guiding pins 242 capable of penetrating cable guiding through holes 245, connector guiding through holes 208 and substrate guiding through holes 204.

Figure 3A:
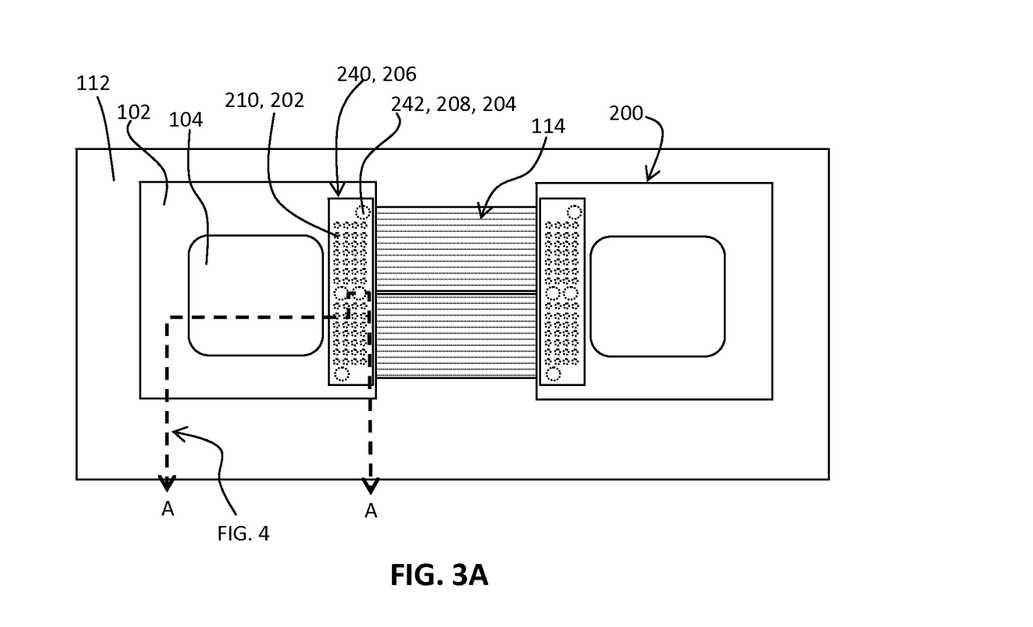
FIG. 3A-FIG. 3D illustrate top views of various embodiments of the invention.

Different configurations of substrate guiding through holes 204 and I/O contact pads 202 formed on substrate package 200 may provide various embodiments of the invention. FIG. 3A illustrates a top view of an embodiment of two substrate packages 200 interconnected with flex cables 114. Both substrate packages 200 may be commonly attached to motherboard 112. In an embodiment, one or both substrate packages 200 may be attached directly to motherboard 112. In another embodiment, one or both substrate packages 200 may be placed in a component socket attached to motherboard 112. In an embodiment, substrate guiding holes 204 and I/O contact pads 202 may be formed on the periphery of substrate packages 200. In an embodiment, flex connector 206, flex cables 114 and guiding plate 240 may be assembled on substrate package 200. The connector guiding through holes 208, cable guiding through holes 245 may be aligned against substrate guiding through holes 204 to form continuous through holes penetrated by guiding pins 242. In an embodiment as illustrated in FIG. 2, substrate packages 200 may include two pluralities of I/O contact pads 202 and four substrate guiding holes 204. Substrate packages 200 may be interconnected with two flex cables 114 with each end having two cable guiding holes 245 as illustrated in FIG. 2.

Figure 3B:
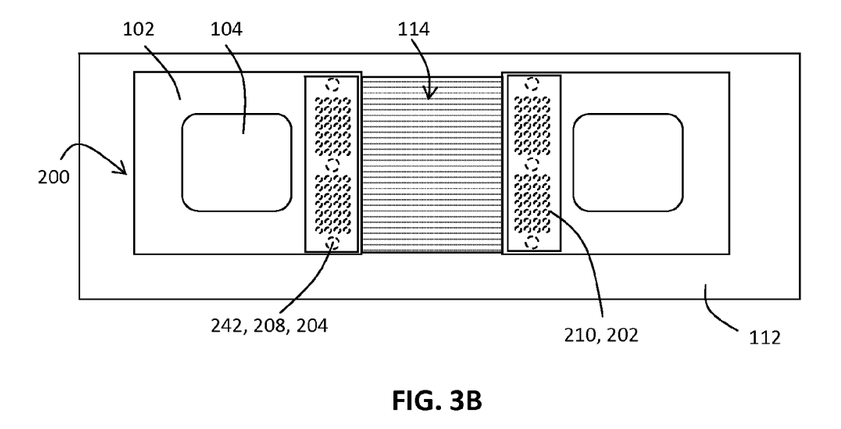
Figure 3C:
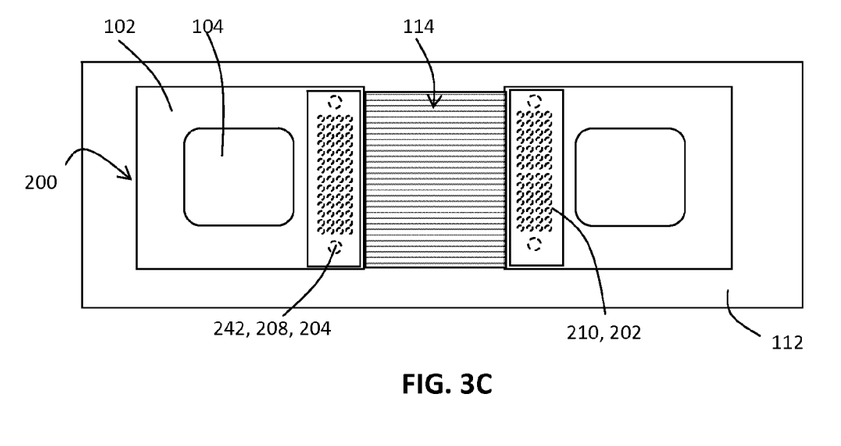
Figure 3D:
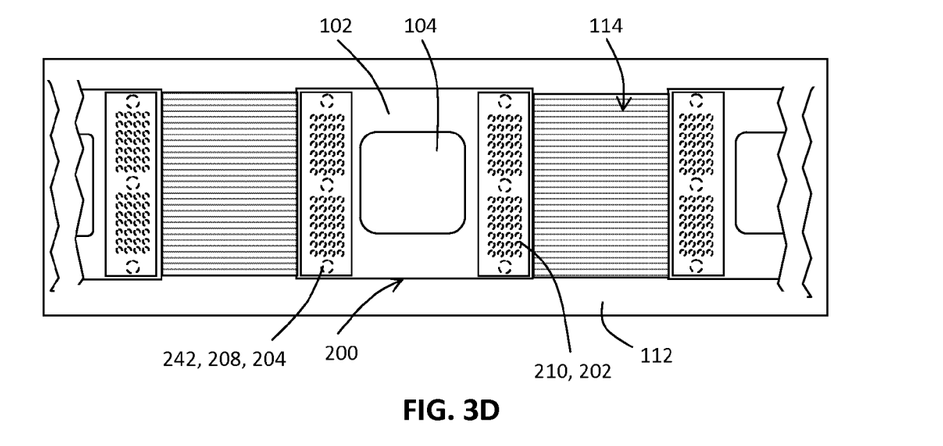

Other embodiments may be contemplated. FIG. 3B illustrates a top view of an embodiment of substrate packages 200 having three substrate guiding through holes 204 and two pluralities of I/O contact pads 202 on each substrate package 200. Substrate packages 200 may be connected with a single flex cable 114. FIG. 3C illustrates a top view of another embodiment of substrate packages 200 having two substrate guiding holes 204 and a plurality of I/O contact pads 202, and interconnected with a single flex cable 114. Other embodiments may include interconnecting more than two substrate packages 200. FIG. 3D illustrates an embodiment having three substrate packages 200 interconnected with flex cables 114. Various embodiments other than the ones illustrated in FIGS. 3A-3D may be possible.

Figure 4:
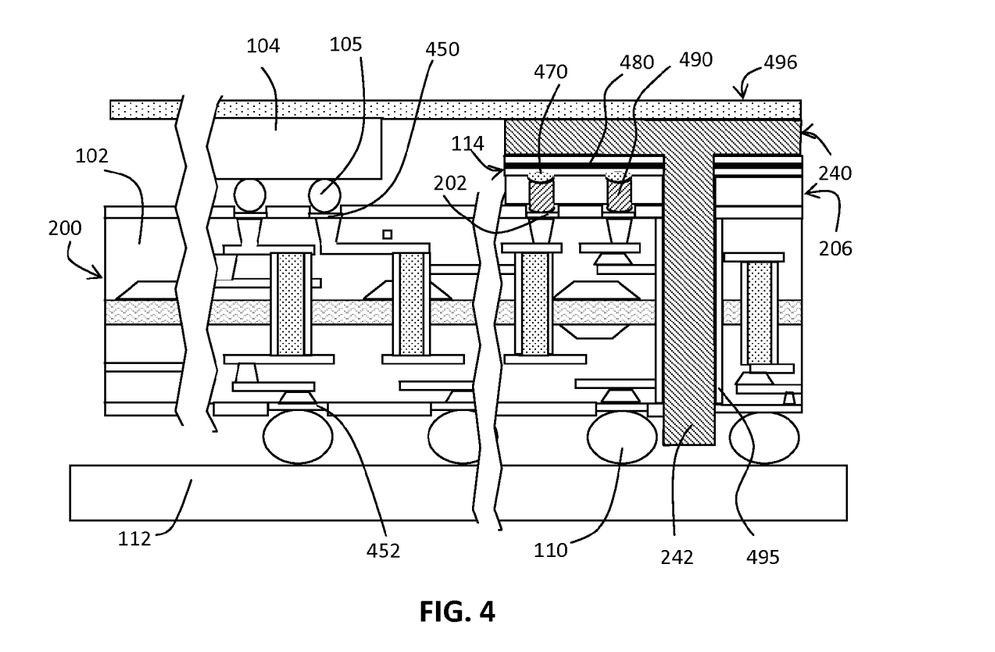
FIG. 4 illustrates a cross sectional view of an embodiment of the invention.

Next, details of the assembly of various parts according to an embodiment will be explained. FIG. 4 illustrates a cross sectional view of an embodiment of the invention obtained from cross section A-A depicted in FIG. 3A. Semiconductor die 104 may be mechanically and/or electrically coupled to a plurality of die bump pads 450 formed on the top surface of substrate body 102 via die bumps 105. In another embodiment, other types of die-substrate interconnection such as wire-bonding may be possible. In an embodiment, one or more pluralities of high speed I/O contact pads 202 may be formed on the periphery of substrate body 102. In an embodiment, I/O contact pads 202 may be electrically coupled to die bump pads 450 such that signals from die 104 may be transmitted to I/O contact pads 202 as well as signals from other substrate packages 200 may be received via I/O contact pads 202 and be transmitted to die 104. In another embodiment, two or more pluralities of I/O contact pads 202 may be formed on substrate body 102, e.g., the periphery of the substrate body 102. The pluralities of I/O contact pads 202 may enable inter-package connection between two or more substrate packages 200.

According to an embodiment, substrate package 200 may include a plurality of substrate guiding through holes 204. Substrate guiding through holes 204 may be provided as a mechanical alignment feature to guide assembly of flex connector 206, flex cables 114, and guiding plate 240 on substrate package 200. Referring to FIG. 3A and FIG. 4, connector guiding through holes 208 and cable guiding through holes 245 may be aligned against substrate guiding through holes 204 to form continuous through holes penetrated by guiding pins 242. In an embodiment, substrate guiding through holes 204 may be formed adjacent to and between pluralities of I/O contact pads 202.

In an embodiment, substrate guiding through holes 204 may be hermetically-sealed through holes formed on substrate body 102. Substrate guiding holes 204 may be impervious to moisture to prevent moisture from seeping into substrate body 102. In an embodiment, substrate guiding through holes 204 are electrically isolated from I/O contact pads 202, die bump pads 450 and the internal circuitry of substrate package 200. In an embodiment, substrate guiding through holes 204 may be electrically grounded. In an embodiment, the hermetic sealing of substrate guiding through holes 204 is provided by a layer of metal 495 on the hole wall of substrate guiding through holes 204 as illustrated in FIG. 4. In an embodiment, the hole wall of substrate guiding holes 204 may be metalized to provide, e.g., moisture barrier. For example, copper or the like may be used to metalize the hole wall. In an embodiment, the diameter of substrate guiding through holes 204 is independent of the size of substrate package 200.

According to an embodiment, flex connector 206 may be provided as an interface to bridge connection between substrate package 200 and flex cables 114. In another embodiment, flex connector 206 may not be required and flex cables 114 may be disposed directly on substrate package 200. In an embodiment as illustrated in FIG. 2, flex connector 206 may include one or more pluralities of electrically conductive connector contacts 490 and one or more pluralities of connector guiding holes 208 corresponding to the layout of I/O contact pads 202 and substrate guiding holes 204 of substrate package 200. Each connector contact 490 may include a top portion and a bottom portion. When connector guiding holes 208 are properly aligned with substrate guiding through holes 204, the bottom portion of connector contacts 490 may make contact with I/O contact pads 202. In an embodiment, flex connector 206 may be made from copper that may have a surface finish. In an embodiment, the surface finish may comprise Ni/Au to provide separable connections to the substrate pads or flex cable pads. In another embodiment, any other materials for interconnect may be utilized for the surface finish, e.g., including but not limit to solder materials such as SnA3Ag0.5Cu, Sn0.7Cu, Sn5Sb, Sn3.5Ag, to provide interconnection to the package substrate or flex cable.

Referring back to FIG. 2, according to an embodiment, one or more flex cables 114 may be disposed on flex connector 206. Flex cable 114 provides electrical connection between substrate packages 200. In an embodiment, flex cable 114 may comprise a connector region 246 on each end of flex cable 114. In an embodiment, connector region 246 may include a plurality of cable contacts 470 formed on a bottom side of connector region 246 and a plurality of cable guiding through holes 245. As illustrated in FIG. 4, cable guiding through holes 245 may be aligned with connector guiding through holes 208 and substrate guiding through holes 204. Cable contacts 470 may make contact with the top portion of connector contacts 490 and thus form connection between flex cable 114 and substrate package 200. Cable contacts 470 on both ends of flex cable 114 may be electrically connected by way of a plurality of cable circuit lines 480. In another embodiment, one or more flex cables 114 may be disposed directly on substrate package 200. Cable contacts 470 may contact with I/O contact pads 202 directly to provide connection between flex cable 114 and substrate package 200.

Figure 5A:
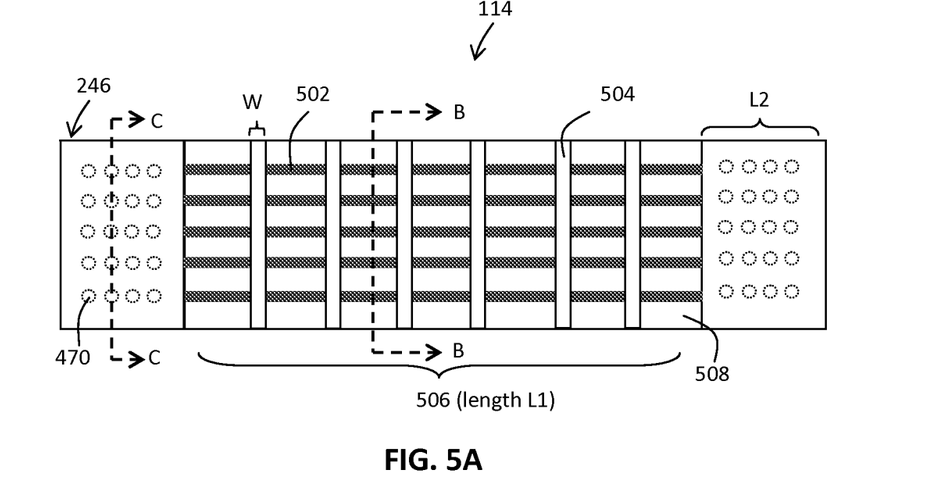
FIGS. 5A to 5C illustrate a top view and cross sectional views of an embodiment of the invention, respectively.
Figure 5B:
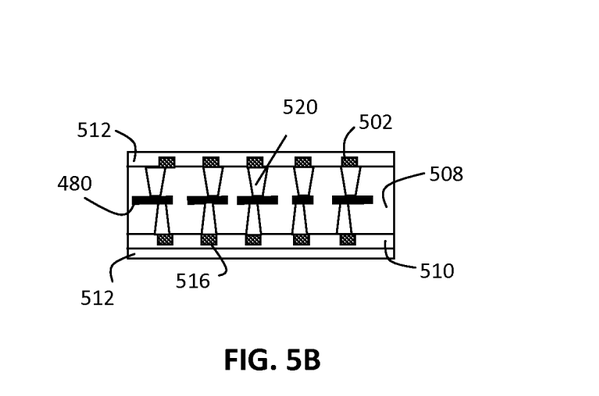
Figure 5C:
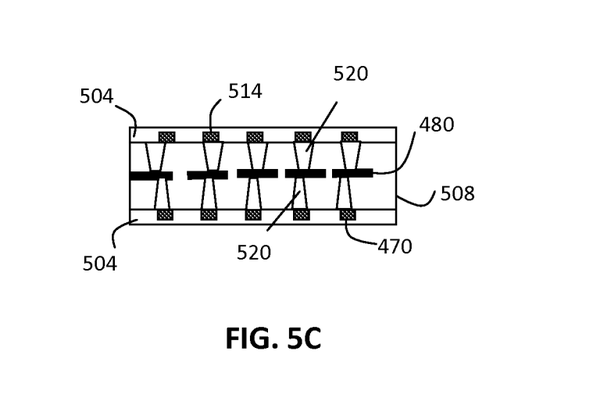

Referring to FIG. 5C, in an embodiment, connector region 246 may be polyimide-based or liquid crystal polymer-based. In an embodiment, cable contacts 470 may be provided on dielectric layer 508 that may comprise polyimide or liquid crystal polymer. The dielectric layer 508 may have a thickness in a range from about 25 um to 100 um; however, in some embodiment, the dielectric layer 508 may have a different thickness. A ground plane 510 may be formed on an opposite side of dielectric layer 508. A solder mask 504 may be disposed on cable contacts 470 and/or the ground plane 510 and solder mask 504 may be used to protect cable contact 470 and ground plane 510.

Referring to FIG. 2 and FIG. 4, according to an embodiment of the invention, guiding plate 240 may be disposed on an aligned assembly of flex cables 114, flex connector 206 and substrate package 200. In an embodiment, guiding plate may include a plurality of guiding pins 240. Guiding pins 242 are provided to maintain alignment of flex cables 114 and substrate package 200 and/or flex connector 206. Flex cables 114 and substrate package 200 and/or flex connector 206 may be aligned and disposed below guiding plate 240. For example, guiding pins 242 may penetrate cable guiding through holes 245, connector guiding through holes 208 and substrate guiding through holes 204 to prevent lateral displacement of guiding plate 240, flex cable 114 and flex connector 206 relative to substrate package 200. In an embodiment, guiding pins 242 may penetrate the entire depth of substrate body 102 and protrude from the bottom surface of substrate body. In another embodiment, guiding pins 242 may be suspended within substrate guiding through holes 204. In an embodiment, the bottom end of guiding pins 242 may not require mechanical support. In an embodiment, guiding pins 242 may be formed on the bottom side of guiding plate 240 and correspond to the layout of substrate guiding through holes 204.

Still referring to FIG. 4, flex cables 114 and flex connector 206 may be pressed against substrate package 200 by way of the mechanical load of guiding plate 240. Flex cables 114 may be compressively clipped by guiding plate 240 on the top and flex connector 206 at the bottom. In an embodiment, heat sink 496 may be disposed on die 104 to dissipate heat generated by die 104. In another embodiment, heat sink 496 may be designed to be large enough such that a portion of heat sink is disposed on guiding plate 240 as illustrated in FIG. 4. In an embodiment, the cumulative height of the assembly of flex connector 206, flex cables 114 and guiding plate 240 from substrate body 102 may be designed to be coplanar with the height of the top surface of die 104 from substrate body 102. The compressive load of heat sink 496 against guiding plate 240 assists in maintaining the alignment of the assembly of guiding plate 240, flex cables 114, flex connector 206 and substrate package 200.

FIG. 5A illustrates a top view of an embodiment of flex cable 114 and FIG. 5B illustrates a cross sectional view obtained from cross section B-B depicted in FIG. 5A. Referring to FIGS. 4, 5A and 5B, flex cables 114 may comprise connector region 246 and transmission region 506. Connector region 246 may comprise a plurality of cable contacts 470 that may be coupled to I/O contact pads 202 or via connector pads 210. In another embodiment, cable contacts 470 may be electrically coupled to a plurality of interconnects 502. In one embodiment, cable contacts 470 and interconnects 502 may be formed on opposite sides of the flex cable 114. Interconnects 502 may comprise traces that may be used to transmit signals or information between substrate packages. In another embodiment, a ground plane 510 may be provided on an opposite side of transmission region 506. Ground plane 510 may comprise a plurality of ground traces 516. A dielectric layer 508 may be provided between traces 502 and ground plane 510. Exemplary materials for dielectric layer 508 may comprise polyimide or liquid crystal polymer.

In one embodiment, traces 502 may extend along transmission region 506 of flex cable 114. For example, flex cable 114 may have a length of about 2 inches to about 20 inches; however, in some embodiments, flex cable 114 may have a different length. In another embodiment, transmission region 506 may have a length L1 of about 2 inches to about 20 inches; however, in some embodiments, transmission region 506 may have a different length. In another embodiment, flex connector region 246 may have a length L2 of around 0.5 inch to around 0.75 inch; however, in some embodiments, connector region 246 may have a different length.

Referring to FIG. 5A, a plurality of solder mask regions 504 may be formed on transmission region 506. A solder mask region 504 may be disposed to partially cover at least a portion of a trace 502. In one embodiment, solder mask regions 504 may be patterned into a plurality of strips, lines, or strings. For example, solder mask region 504 may be formed by, e.g., photolithography. Solder mask regions 504 may intersect traces 502 to mechanically anchor traces 502 on dielectric layer 508. In one embodiment, a width W of solder mask region 504 may be approximately 500 um to approximately 1000 um; however, in other embodiments, solder mask region 504 may have a different width. In another embodiment, an interval between adjacent solder mask regions 504 may be around 1 inch; however, in some embodiments, adjacent solder mask regions 504 may have a different interval to mechanically maintain traces 502 on dielectric layer 508 and prevent traces 508 from lifting. In one embodiment, solder mask regions 504 may not intersect with each other. In another embodiment, solder mask regions 504 may be disposed in parallel; however, in some embodiments, this may not be required.

Referring to FIG. 5B, in one embodiment, a layer of organic solderability preservative (OSP) 512 may be disposed on a portion of each trace 502 that is not covered by solder mask 504. In another embodiment, OSP 512 may be provided on, e.g., a top side, of the transmission region 506 to cover the traces 502 and no solder mask may be provided on the transmission region 506. In another embodiment, OSP 512 may be provided on the whole top surface of the transmission region 506 to cover the traces 502. In another embodiment, ground plane 510 and/or ground traces may be coated with OSP layer 512. In one embodiment, OSP layer 510 may be provided on exposed traces 502, exposed ground traces 516, and/or ground plane 510 to protect the exposed traces and ground plane 510. For example, OSP layer 510 may have a thickness of around 50 nm to around 250 nm; however, in other embodiments, OSP layer 510 may have a different thickness. In one embodiment, copper may be used for traces 502 and ground traces 516; however, other interconnect materials may be used. In an embodiment, ground traces 516 may not be required. In another embodiment, traces 502 may be coupled to ground traces 516 via, e.g., vertical interconnect structure such as microvias 520. In another embodiment, dielectric layer 508 may comprise cable circuit lines 480 or any other internal interconnect that may electrically coupled to microvias 520; however, in some embodiment, cable circuit lines 480 in the transmission region 506 may not be required.

Referring to FIG. 5C, in an embodiment, the connector region 246 may comprise cable contacts 470. The connector region 246 may comprise top pads 514 that may be electrically coupled to the traces 502 in the transmission region 506. Cable contacts 470 and top pads 514 may be provided on opposite sides of the flex cable 114. Top pads 514 and traces 502 may be provided on the same side of the flex cable 114. Dielectric layer 508 may be provided between cable contacts 470 and top pads 514. Cable contacts 470 and top pads 514 may be electrically coupled with each other via vertical interconnect structure such as microvias 520 that may be electrically coupled to cable circuit lines 480 in dielectric layer 508.

In an embodiment, cable contacts 470 may comprise pads or any other interconnects. In one embodiment, exemplary materials for cable contacts 470 may comprise copper or any other interconnect materials. In an embodiment a finish may be formed on cable contacts 470. Exemplary materials for the finish on cable contacts 470 may comprise Ni and/or Au; however, in some embodiments, the finish materials may comprise immersion tin, immersion silver, immersion gold or the like. In another embodiment, a OSP finish may be provided on top pads 514. In another embodiment, the Ni/Au may not be required and OSP may be used as a finish on cable contacts 470. In another embodiment, the cable contacts 470 with the OSP finish or other finish may further be coated with a solder mask 504. Solder mask 504 may be provided on top pads 514 that may have the OSP finish or other finish. In some embodiments, the OSP finish may not be required on cable contacts 470 and/or top pads 514.

In one embodiment, flex cables 114 may provide high speed signaling, e.g., greater than about 10 Gb/s, between substrate packages 200. In another embodiment, flex cables 114 may be used to provide a transmission loss less than or equal to 0.2 dB/cm@5 GHz; however, in some embodiments, other transmission loss may be provided.

Figure 6:
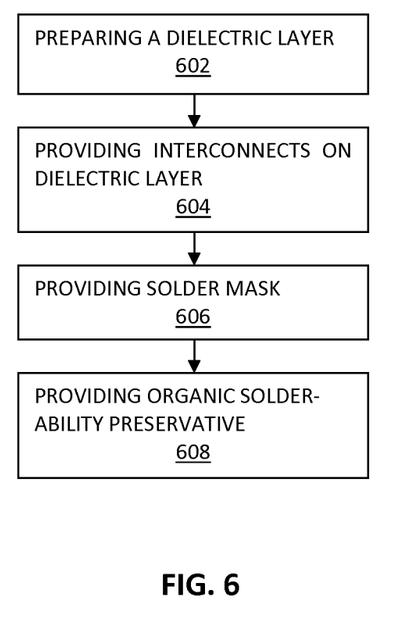
FIG. 6 illustrates a method according to an embodiment of the invention.

FIG. 6 illustrates a method according to an embodiment of the invention. The method will be described below with reference to FIGS. 4, 5A-5C and 6. In block 602, dielectric layer 508 may be prepared. Exemplary materials for dielectric layer 508 may comprise polyimide or liquid crystal polymer that may have a thickness from about 25 um to 100 um; however, in some embodiments, a different thickness may be utilized. In one embodiment, cable circuit lines 480 may be formed in dielectric layer 508 at two ends of dielectric layer 508. In block 604, a plurality of cable contacts 470 and corresponding top pads 514 may be formed on the two ends of dielectric layer 508 to form connector region 246 of cable 114. In an embodiment, cable contacts 470 on two ends of cable 114 may be electrically coupled to cable circuit lines 480. In another embodiment, a plurality of cable interconnects, e.g., traces 502 may be formed on portions of dielectric layer 508 other than the connector region 246 to form transmission region 506. Plating, sputtering and other trace forming method may be used to form traces 502 on dielectric layer 508. The traces 502 may be formed on the same main surface of dielectric layer 508, e.g., a top surface as shown in FIG. 5A. In an embodiment, a trace 502 may be electrically coupled to a corresponding cable contact 470 via the vertical interconnect structures such as microvias 520. In another embodiment, ground plane 510 and/or ground traces 516 may be formed on an opposite of dielectric layer 508. Ground plane 510 under the connector region 246 may be formed integrally with ground plane 510 under the transmission region 506; however, in some embodiments, they may be formed individually.

In block 606, solder mask 504 may be disposed on cable contacts 470, top pads 514 and/or cable traces 502. In an embodiment, solder mask 504 may be patterned to cover cable contacts 470, top pads 514 and partially cover a portion of traces 502, e.g., by photolithography. For example, solder mask 504 on traces 502 may have a shape of a plurality of strips, lines, strings that may intersect the plurality of traces 502. Solder mask 504 on traces 502 may be used to provide anchoring for traces 502. In an embodiment, adjacent solder mask strips may have an interval of around 1 inch; however, some embodiments may have a different interval. In another embodiment, a solder mask strip may have a width of around 0.5 mm to around 1 mm; however, in some embodiments, other width may be utilized. In block 606, traces 502 and ground traces 516 may be electrically coupled via internal interconnects such as microvias 520 and/or cable circuit lines 480. In another embodiment, internal interconnects such as microvias 520 and/or cable circuit lines 480 may be used to couple cable connectors 470 and top pads 514 that may couple to traces 502.

In block 608, organic solderability preservative (OSP) material 512 may be coated on a portion of traces 502 and ground plane 510. In an embodiment, OSP material 512 may be formed on the exposed portion of traces 502 where no solder mask 504 is formed. In another embodiment, OSP material 512 may be formed on the portion of ground plane 510 in the transmission region 506. In an embodiment, the coating of OSP material 512 may have a thickness of around 50 nm; however, some embodiments may have a different thickness. OSP material 512 on ground plane 510 may further cover ground traces 516.

While FIG. 6 is illustrated to comprise a sequence of processes, the methods in some embodiments may perform illustrated processes in a different order. In some embodiments, a finish may be formed on cable contacts 470 and top pads 514 before providing solder mask 504. In an embodiment, OSP finish may be formed on cable contacts 470 and/or top pads 514; however, in some embodiments, OSP finish may not be required and other finish may be used. In another embodiment, the OSP finish in the connector region 246 may be formed at the time of forming OSP layer 512 in transmission region 506.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. An electronic assembly, comprising:
   a first substrate package and a second substrate package;
   a plurality of input/output (I/O) contact pads on the packages, wherein the plurality of I/O contact pads is electrically coupled to at least one of the first substrate package and the second substrate package;
   a plurality of cable contacts on both ends of a flex cable, wherein the plurality of cable contacts is electrically connected with the plurality of I/O contact pads of the packages;
   a plurality of traces on a side of the flex cable and extended between both ends of the flex cable, wherein the plurality of traces is electrically coupled to the plurality of cable contacts;
   a plurality of solder mask strips on the plurality of traces, wherein the plurality of solder mask strips intersect the plurality of traces; and
   an organic solderability preservative material on at least a portion of the plurality of traces that is not covered by the plurality of solder mask strips.

2. The assembly of claim 1,
   wherein each package includes a die attached to a plurality of die bump pads, and wherein the plurality of I/O contact pads is electrically connected with the plurality of die bump pads.

3. The assembly of claim 1, further comprising:
a flex connector disposed between each of the package and the flex cable, wherein the flex connector includes a plurality of connector contacts that is electrically connected with the plurality of I/O contact pads and the plurality of cable contacts.

4. The semiconductor device of claim 1, further comprising:
a plurality of substrate guiding through holes formed on each of the packages;
a plurality of cable guiding through holes formed on both ends of the flex cable; and
a guiding plate disposed on each end of the flex cable, wherein the guiding plate includes a plurality of guiding pins penetrating the plurality of substrate guiding through holes and the plurality of cable guiding through holes.

5. The semiconductor of claim 3, further comprising:
a plurality of substrate guiding through holes formed on each of the packages;
a plurality of cable guiding through holes formed on both ends of the flex cable;
a plurality of connector guiding through holes formed on the cable connector; and
a guiding plate disposed on each end of the flex cable, wherein the guiding plate includes a plurality of guiding pins penetrating the plurality of substrate guiding through holes, the plurality of cable guiding through holes and the plurality of connector guiding through holes.

6. The assembly of claim 1, wherein comprising:
a ground plane formed on an opposite side of the flex cable, wherein the organic solderability preservative material is further formed on a portion of the ground plane that corresponds to the plurality of traces.

7. The assembly of claim 1, wherein the first package comprises one selected from the group comprising processors, microprocessors, digital signal processors, microcontrollers and the second package comprises a memory device.

8. The assembly of claim 1, further comprising:
a third substrate package, wherein the third substrate package comprises a third die, and wherein the third substrate package is coupled to one of the first substrate package and the second package via a second flex cable.

9. The assembly of claim 8, wherein the second flex cable comprises a second plurality of cable contacts that is electrically connected with a second plurality of cable contacts formed on said one of the first substrate package and the second package.

10. A flex cable, comprising:
a connector region formed on both ends of the flex cable, wherein the connector portion comprises a plurality of cable contacts;
a transmission region formed between both ends of the flex cable, wherein the transmission portion comprise a plurality of traces that is electrically coupled to the plurality of cable contacts;
a solder mask formed on the plurality of cable contacts and a portion of the plurality of traces, wherein the solder mask on the transmission region has a shape of a plurality of strips that intersect the plurality traces; and
an organic solderability preservative (OSP) material formed on the plurality of traces where the solder mask is not formed.

11. The flex cable of claim 10, further comprising:
a ground plane formed on a side of the flex cable that is opposite to the plurality of cable contacts and the plurality of traces, wherein the solder mask is disposed on a first portion of the ground plane in the connector region and the OSP material is disposed on a second portion of the ground plane in the transmission region.

12. The flex cable of claim 10, wherein the OSP material has a thickness of approximately 50 nm to approximated 250 nm.

13. The flex cable of claim 10, wherein the solder mask strips has a width in a range of approximately 500 um to approximately 1000 um.

14. The flex cable of claim 10, wherein the solder mask strips has an interval of approximately one inch.

15. The flex cable of claim 11, further comprising:
a dielectric layer, wherein the ground plane is attached to one side of the dielectric layer and the plurality of cable contacts and the plurality of traces attached to the other side of the dielectric layer; and
one or more cable circuit lines formed in the dielectric layer to couple the plurality of cable contacts on both ends of the flex cable.

* * * * *